United States Patent [19]

Hara et al.

[11] Patent Number: 5,013,955
[45] Date of Patent: May 7, 1991

[54] DRIVE SYSTEM OF ACTUATOR HAVING PIEZOELECTRIC DEVICE FOR USE IN MOTOR VEHICLE

[75] Inventors: Yoshimichi Hara, Kuwana; Eiju Matsunaga, Anjo; Hiroyuki Kawata, Chiryu; Akira Hukami, Okazaki; Yutaka Suzuki, Nishio; Makoto Shiozaki, Kariiya; Yuji Yokoya, Toyota; Yasuhiro Tsutsumi, Susono, all of Japan

[73] Assignees: Nippondenso Co., Ltd., Kariya; Toyota Jidosha Kabushiki Kaisha, Toyota, both of Japan

[21] Appl. No.: 535,194

[22] Filed: Jun. 7, 1990

[30] Foreign Application Priority Data

Jun. 7, 1989 [JP] Japan .................................. 1-144865
Jun. 7, 1989 [JP] Japan .................................. 1-144868

[51] Int. Cl.⁵ .............................................. H01L 41/08
[52] U.S. Cl. ..................................... 310/316; 310/328
[58] Field of Search ............... 310/316, 317, 323, 328; 318/116

[56] References Cited

U.S. PATENT DOCUMENTS

| | | | |
|---|---|---|---|
| 3,573,781 | 4/1971 | Shoh ................................ | 310/317 X |
| 3,819,961 | 6/1974 | Bourgeois et al. ................. | 310/316 |
| 3,828,773 | 8/1974 | Buch et al. ....................... | 310/317 X |
| 4,888,514 | 12/1989 | Takahashi et al. ................ | 310/316 |
| 4,901,034 | 2/1990 | Frank-Peter ..................... | 310/316 X |

FOREIGN PATENT DOCUMENTS 6185210  4/1986 Japan .
61230507 10/1986 Japan .
6412880  1/1989 Japan .
1202177  8/1989 Japan .
1208213  8/1989 Japan .

Primary Examiner—Mark O. Budd
Attorney, Agent, or Firm—Cushman, Darby & Cushman

[57] ABSTRACT

A drive system of a piezo-type actuator for use in a motor vehicle, which piezo-type actuator is constructed with a piezoelectric device which is expandable and contractible in accordance with application of a voltage thereto. The drive system includes a voltage-increasing section for increasing an output voltage of a power source mounted on the motor vehicle so as to develop a drive voltage for the piezo-type actuator and a voltage-application section for applying to the piezoelectric device of the piezo-type actuator the drive voltage. Also included in the drive system is an abnormality detection section which is arranged so as to an abnormality of the drive voltage developed by the voltage-increasing section. A safety controller is responsive to an abnormality signal from the abnormality detection section for prohibiting the application of the drive voltage to the piezoelectric device thereof and further discharging charges accumulated in the piezoelectric device thereof when the abnormality detection section detects the abnormality of the developed drive voltage. With this arrangement, it is possible to prevent troubles due to the abnormality of the drive voltage to be applied to the piezoelectric device of the piezo-type actuator.

12 Claims, 14 Drawing Sheets

DRIVE SYSTEM OF ACTUATOR HAVING PIEZOELECTRIC DEVICE FOR USE IN MOTOR VEHICLE

BACKGROUND OF THE INVENTION

The present invention relates generally to a drive or control system for actuators driven by a piezoelectric device (which will hereinbelow be referred to as a piezo-type actuator) which are employed, for example, as a system of controlling a damping force of a shock absorber for use in motor vehicles.

Recently, in motor vehicle fields, piezoelectric devices have been employed for actuators such as an apparatus for controlling a damping force of a shock absorber, as disclosed in the Japanese Patent Provisional Publication No. 61-85210, and a drive apparatus of a fuel-pressurizing piston in a fuel injection system, because of high-responsive expansion and contraction due to application of a voltage thereto. One of the majer problems arising in the use of the piezoelectric device is instability and failure of operation resulting from various causes such as impedance variation due to wire connection trouble and application voltage variation due to instability of the output voltage or damage of a power source, thereby resulting in inaccurate operation of the piez-type acturator.

On the other hand, in order to ensure the accurate operation of the piezoelectric device, it is effective to perform operation test of the piezoelectrice device at predetermined intervals or at irregular intervals. However, this operation test of the piezoelectric device can provide a new problem in terms of smooth switching from the test operation to the actual operation. That is, for example, in the case that the piezo-type actuator is used for a variable damping force type shock absorber, when the motor vehicle starts to run after completion of the piezoelectic device test, there is the possibility that the piezo-type actuator acts against the state of the vehicle-running road surface so as not to give a comfortable ride to passengers in the motor vehicle. Further, in the operation test mode, there is the possibility that a high voltage is kept to be applied to the piezoelectric device irrespective of the vehicle stopping. This causes current leakage which can give a damage to the vehicle driver in maintenance.

Moreover, when as disclosed in the above-mentioned Japanese Patent Provisional Publication No. 61-85210 the piezoelectric device comprising laminated piezoelectric elements is employed for a variable damping force type shock absorber, a high voltage (for example, 500 V) is arranged to be applied from an external power source through a connection wire system, disposed in a hollow portion of a piston rod, to the piezoelectric device. Thus, it is required to take a countermeasure against the high-voltage application to the piezoelectric device through the connection wire system.

SUMMARY OF THE INVENTION

It is therefore an object of the present invention to provide a control system of a piezo-type actuator for use in motor vehicles which is capable of preventing the operation trouble of a piezoelectric device used in the piezo-type actuator due to the voltage abnormality or others and further accurately performing expanding and contracting operation of the piezoelectric device in accordance with the state of the vehicle-running road surface irrespective of the execution of the operation test or others.

With this object and features which will become apparent as the description proceeds, in the drive system of a piezo-type actuator equipped with a piezoelectric device which is expandable and contractible in accordance with application of a voltage thereto, there is provided a voltage-increasing means which increases the battery voltage to apply the increased voltage to the piezoelectric device of the piezo-type actuator and there is also provided an abnormality detection means which is responsive to the output voltage of the voltage-increasing means for detection of the abnormality of the increased voltage. When the abnormality detection means detects the abnormality of the increased voltage, a drive-voltage stopping means outputs a stopping signal to the voltage-increasing means so as to stop the output of the drive voltage to the piezoelectric device or stop the voltage-increasing operation. Moreover. in response to the stopping signal therefrom, a charge-discharging means causes the charge in the piezoelectric device to be discharged therefrom. That is, with the above-mentioned arrangement, in response to the drive voltage abnormality, it is possible to rapidly and compulsively discharge the charge stored in the piezoelectric device concurrent with stopping the application of the drive voltage to the piezoelectric device, thereby preventing the abnormal operation of the piezo-type actuator.

In accordance with the prevent invention, there is provided a drive system of a piezo-type actuator for use in a motor vehicle, the piezo-type actuator being constructed with a piezoelectric device which is expandable and contractible in accordance with application of a voltage thereto, the drive system comprising: voltage-increasing means for increasing an output voltage of a power source mounted on the motor vehicle so as to develop a drive voltage for the piezo-type actuator; application means for applying to the piezoelectric device of the piezo-type actuator the drive voltage developed by the voltage-increasing means; abnormality detection means for detecting an abnormality of the drive voltage developed by the voltage-increasing means; prohibition means for prohibiting the output of the drive voltage from the voltage-increasing means to the piezoelectric device thereof in response to the detection of the drive voltage abnormality; and discharging means for discharging charges accumulated in the piezoelectric device thereof in response to the detection of the drive voltage abnormality.

In accordance with the present invention, there is further provided a drive system for use in a motor vehicle, comprising: a piezo-type actuator comprising a piezoelectric device which is expandable and contractible in accordance with application of a voltage thereto; voltage-increasing means for increasing an output voltage of a power source mounted on the motor vehicle so as to develop a drive voltage for the piezo-type actuator; application means for applying to the piezoelectric device of the piezo-type actuator the drive voltage developed by the voltage-increasing means; abnormality detection means for detecting an abnormality of the drive voltage developed by said voltage-increasing means; and safety control means for prohibiting the application of the drive voltage to the piezoelectric device thereof and further discharging charges accumulated in the piezoelectric device thereof when the abnormality detection means detects the abnormality of the developed drive voltage.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1:
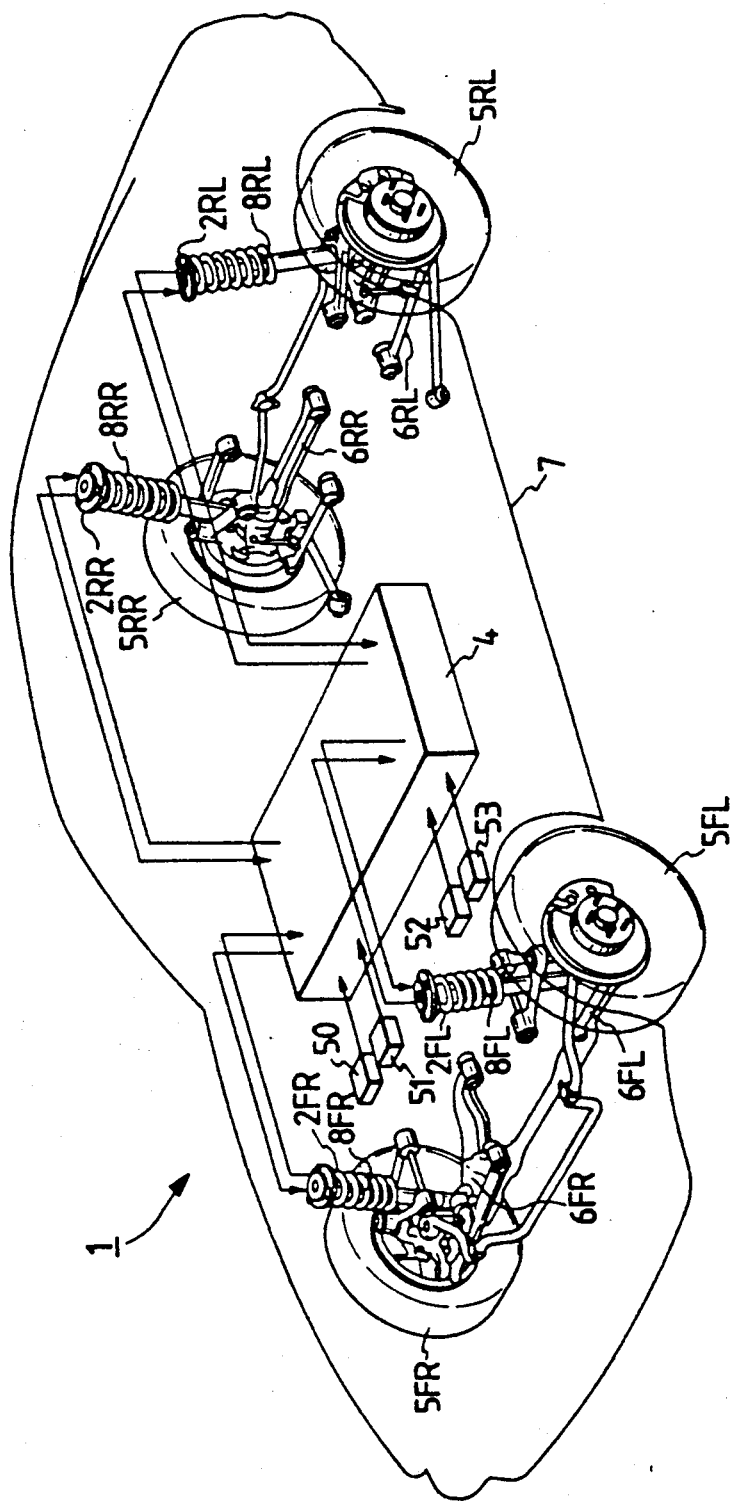
FIG. 1 is an illustration of a drive system of a piezo-type actuator according to an embodiment of the present invention employed for a damping force control system incorporated into a motor vehicle.
Figure 2A:
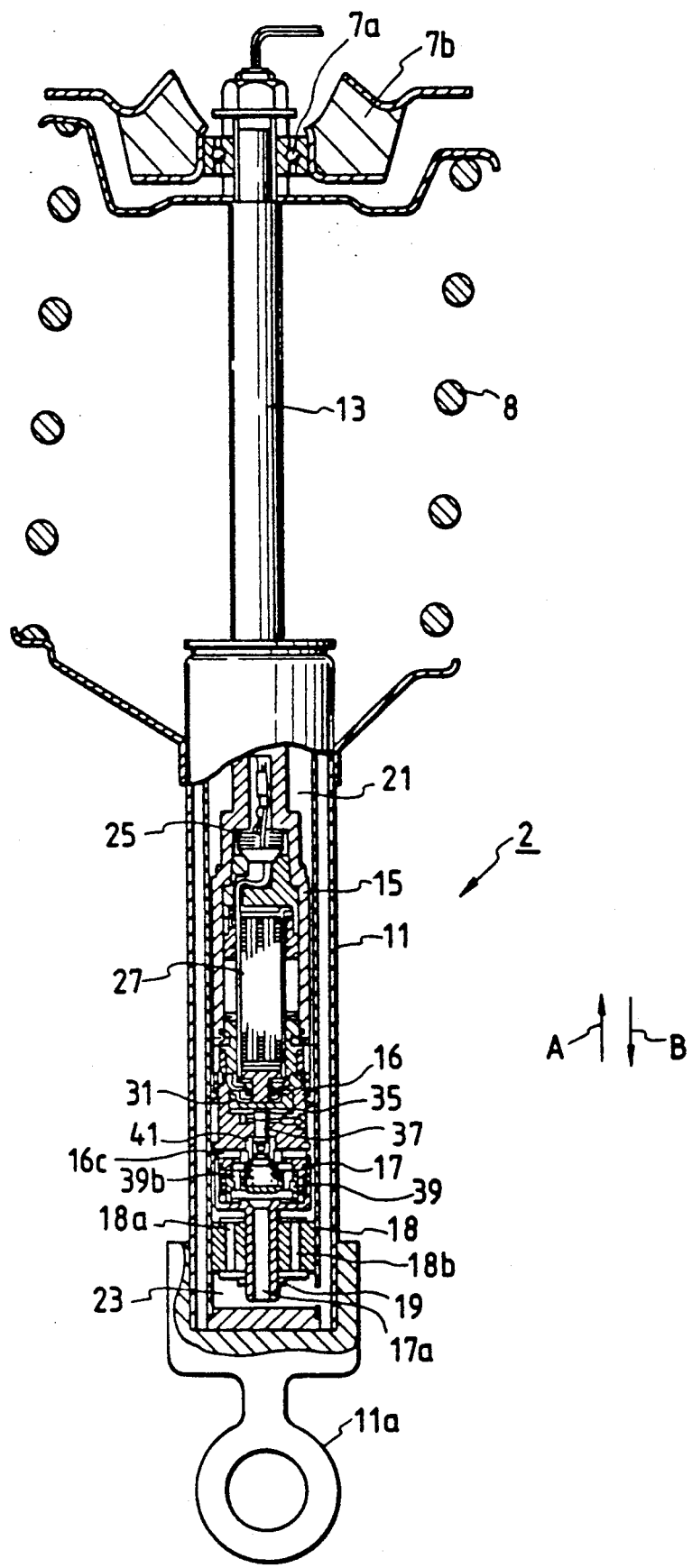
FIG. 2A is a partial cross-sectional view showing an arrangement of a shock absorber of the FIG. 1 damping force control system.
Figure 2B:
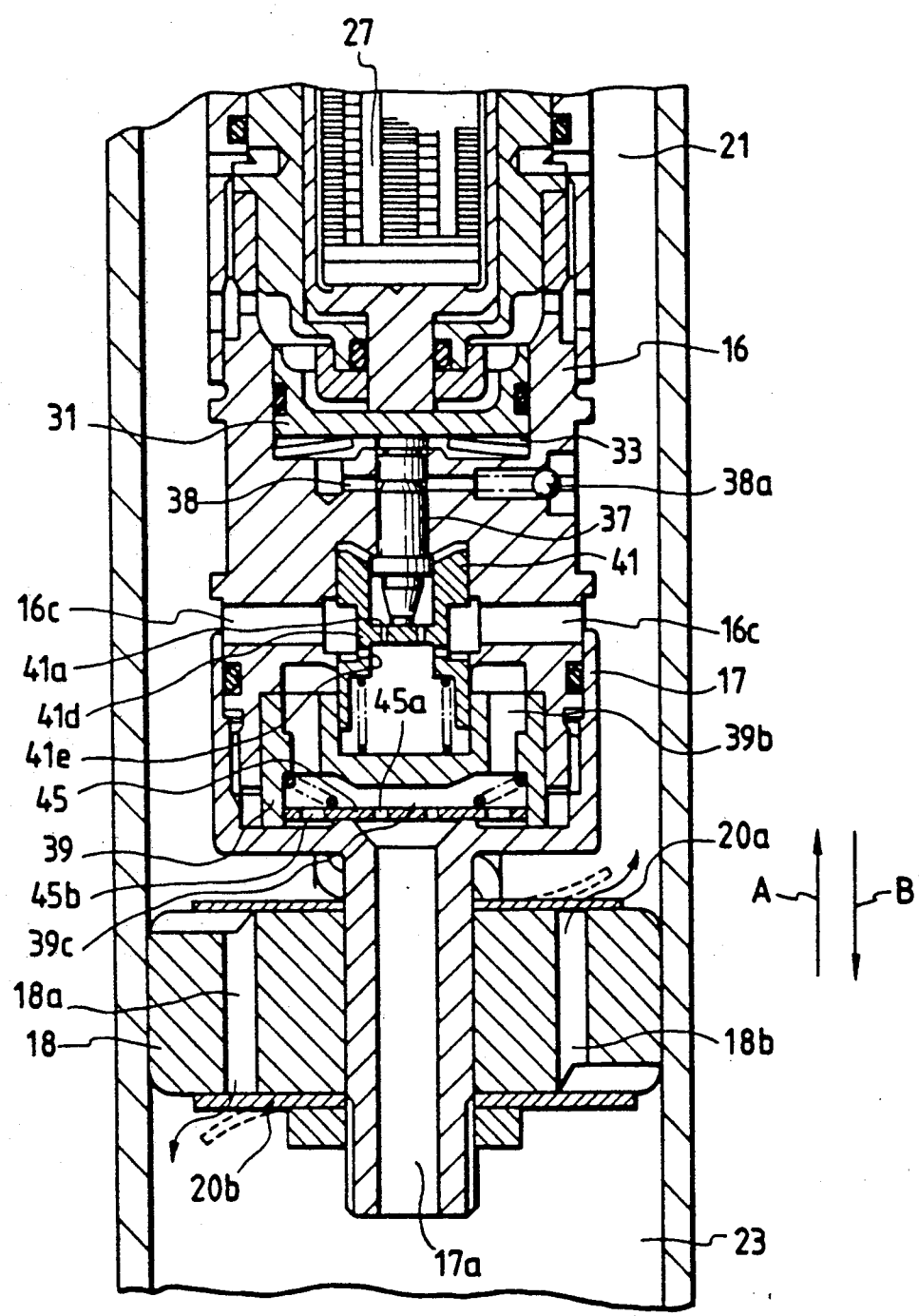
FIG. 2B is an enlarged cross-sectional view showing a portion of the FIG. 2 shock absorber.

Referring now to FIG. 1, there is schematically illustrated a damping force control system equipped with variable damping force type shock absorbers incorporated into a motor vehicle. FIG. 2A is a partial cross-sectional view showing the variable damping force type shock absorber illustrated in FIG. 1 and FIG. 2B is an enlarged cross-sectional view showing a portion of the FIG. 2A shock absorber. In FIG. 1, the damping force control system illustrated at numeral 1 includes variable damping force type shock absorbers (which will hereinafter be referred to as shock absorbers) 2FL, 2FR, 2RL and 2RR and an electronic control unit (ECU) 4 for controlling the damping force of each of the shock absorbers 2FL to 2RR. Each of the shock absorbers 2FL to 2RR, as described hereinafter, is equipped with a piezo-type load sensor for sensing the damping force applied thereto and a piezo-type actuator for changing over the damping force thereof. Further, the shock absorbers 2FL to 2RR, together with coil springs 8FL, 8FR, 8RL and 8RR, are respectively provided between suspension lower-arms 6FL, 6FR, 6RL and 6RR of front-left, front-right, rear-left and rear-right wheels 5FL, 5FR, 5RL and 5RR and a vehicle body 7 of the motor vehicle.

A description will be made hereinbelow in terms of a structure of each of the shock absorbers 2FL to 2RR with reference to FIGS. 2A and 2B. The description will be made typically for the shock absorber 2FL for the front-left wheel 5FL because of having the same structure. Here, the subscripts used for indicating the parts will be omitted for brevity. For example, the reference 2FL of the front-left wheel side shock absorber will be stated to be 2. As illustrated in FIG. 2A, the shock absorber 2 comprises a cylinder 11 and a main piston 18 which is fitted or inserted into the cylinder 11 so as to be slidable along the axis directions of the cylinder 11 as indicated by arrows A and B. A lower portion of the cylinder 11 is fixedly secured through a member 11a to the suspension lower-arm 6, and the main piston 18 is at an upper portion connected to one end portion of a piston rod 13, the other end portion of the piston rod 13 is fixedly secured through a bearing 7a and a vabration proofing rubber 7b to a portion of the vehicle body 7. The coil spring 8 is provided between the portion of the vehicle body 7 and the cylinder 11 so that the piston rod 13, i.e., the main piston 18, is elastically slidable with respect to the cylinder 11. In addition to the above-mentioned main piston 18, in the inside of the cylinder 11 are provided an inner cylinder 15 connected to the piston rod 13, a connection member 16 and a cylindrical member 17. The main piston 18 screwed to the cylindrical member 17 is positioned so as to divide the inside of the cylinder 11 into a first hydraulic chamber 21 and a second hydraulic chamber 23. The flow rate of the operating oil between the first and second hydraulic chambers 21 and 23 is restricted by means of an expansion-side fixed orifice 18a and a contraction-side fixed orifice 18b, thereby normally setting the shock absorber 2 so as to have a high damping force characteristic (HARD characteristic).

As seen in FIGS. 2A and 2B, in the inner cylinder 15 are provided a piezo-type load sensor 25 which is constructed by laminating film-like piezoelectric ceramic plates with electrodes being interposed therebetween so as to form an electrically straining device, whereby the magnitude of the damping force applied to the shock absorber 2 is detectable. Further, in the inner cylinder 15 is housed a piezo-type actuator 27, whereby a piston 31 is operable. The operation of the piston 31 allows movement of a plunger 37 through operating oil in an oil-tight chamber 33 and further permits movement of a spool 41, having a H-shaped cross section, from the original position illustrated in FIG. 2B toward the direction indicated by the arrow B in FIG. 2B.

In response to the movement of the spool 41 toward the arrow B direction, communication is made between a flow sub-passage 16c coupled to the first hydraulic chamber 21, a flow sub-passage 39b of a bush 39 and a flow passage 17a coupled to the second hydraulic chamber 23, thereby increasing the flow rate between the first and second hydraulic chambers 21 and 23. That is, in response to expansion of the piezo-type actuator 27 due to application of a high voltage thereto, the shock absorber 2 is switched from the high damping force state (HARD state) to the low damping force state (SOFT state). On the other hand, in response to contraction of the piezo-type actuator 27 due to discharge of the charge, the shock absorber 2 is again switched from the low damping force state (SOFT state) to the high damping state (HARD state).

In the shock absorber 2, an operating oil supplying passage 38, together with a check valve 38a, is provided between the oil-tight chamber 33 and the first hydraulic chamber 21 so that the amount of the operating oil in the oil-tight chamber 33 is kept to be constant. An oil passage 41d is made in a partition wall 41a of the spool 41, and in an annular channel 40 of the spool 41 is formed a lower-portion communicating hole 41e whose diameter is greater than that of the oil passage 41d. Further, in the shock absorber 2, a slidable plate valve 45 is provided in an end space coupled to the sub-passage 39c of the bush 39, whereby the sliding speed of the main piston 18 in the cylinder 11 is adjusted in accordance with the flowing directions of the operating oil which passes a smaller-size oil hole 45a and greater-size hole 45b formed in the plate valve 45

Leaf valves 20a and 20b are respectively provided in connection with expansion-side and contraction-side passages 18a and 18b formed in the main piston 18 as illustrated in FIG. 2B so as to close one ends of the expansion side and contraction side passages 18a and 18b when the main piston is in the stopping state. In response to the movement of the main piston 18 in the directions indicated by the arrows A and B, the leaf valves 20a and 20b are operable to pen the passages 18a and 18b, respectively. Thus, the operating oil in both the hydraulic chambers 21 and 23 is movable through either the passages 18a and 18b between the hydraulic chambers 21 and 23 in accordance with the movement of the main piston 18. That is, in such a state that the movement of the operating oil between the hydraulic chambers 21 and 23 occurs only through the passages 18a and 18b, the damping force generated by the movement of the rod 13 becomes great and the suspenssion takes the HARD characteristic.

Figure 3:
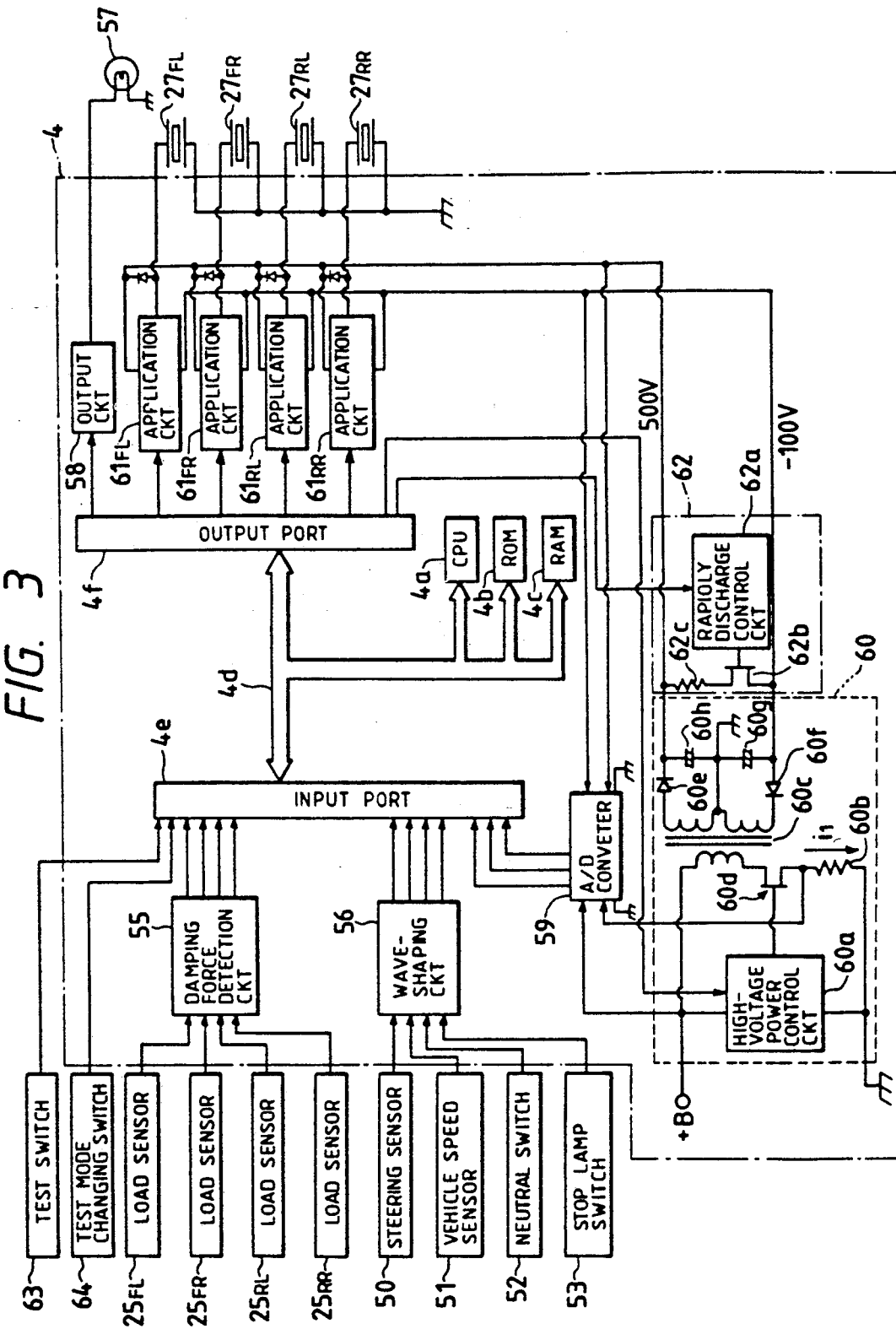
FIG. 3 is a block diagram showing an arrangement of an electronic control unit of the piezo-type actuator drive system of this embodiment.

Secondly, a description will be made hereinbelow in terms of the electronic control unit 4 for controlling the damping force of the shock absorber 2 with reference to FIG. 3. In FIG. 3, the electronic control unit 4 may be constructed as a logical operation circuit (microcomputer) basically comprising a central processing unit (CPU) 4a, a read-only memory (ROM) 4b, a random access memory (RAM) 4c, an input port 4e and an output port 4f which are coupled to each other through a common bus 4d. The input port 4e is coupled through a waveform shaping circuit 56 to a steering sensor 50 for detecting a steering angle of a steering (not shown) of the motor vehicle, a vehicle speed sensor 51 for sensing the speed of the motor vehicle, a neutral switch 52 for detecting the neutral position of a transmission (not shown) of the motor vehicle which is for changing the rotational speed of the vehicle engine, and a stop lamp switch 53 which is arranged to generate a signal in response to depression of a braking pedal (not shown) of the motor vehicle, whereby the electronic control unit 4 is responsive to the signals therefrom. Further, the input port 4e is coupled through a damping force detecting circuit 55 to the respective piezo-type load sensors 25FL, 25FR, 25RL and 25RR so as to be responsive to signals therefrom. Still further, the input port 4e is directly coupled to a test switch 63 and a test-mode changing-over switch 64 which will be described hereinbelow.

On the other hand, the output port 4f is coupled through an output circuit 58 to an abnormality-informing lamp 57 which is for giving abnormality information with lighting, and further coupled through high-voltage application circuits 61FL, 61FR, 61RL and 61RR to the piezo-type actuators 27FL to 27RR, respectively. The respective high-voltage application circuits 61FL to 61RR are also coupled a high-voltage power circuit 60 and a rapidly discharging circuit 62 to a battery (not shown) mounted on the motor vehicle. The high-voltage power circuit 60 is composed of a transformer 60c the secondary side of which is connected to the rapidly discharging circuit 62. Also included in the electronic control unit 4 is an analog-to-digital (A/D) converter 59 which is responsive to the output signals of the high-voltage power circuit 60, the output of the rapidly discharging circuit 62 - and the output signal of the above-mentioned output port 4f, the output signals of the A/D converter 59 being directly supplied to the above-mentioned input port 4e. More specifically, the A/D converter 59 is connected to a primary side wire of the transformer 60c of the high-voltage power circuit 60, a current-detection resistor 60b of the high-voltage power circuit 60, and the secondary side wire of the transformer 60c (i.e., the rapidly discharging circuit 62). That is, the CPU 4a reads, through the A/D converter 59, the voltage VB of the vehicle-mounted battery, secondary side voltages V500, V-100 (500 V, −100 V) of the transformer 60c.

The damping force detecting circuit 55 is composed of four detection circuits respectively corresponding to the piezo-type load sensors 25FL, 25FR, 25RL and 25RR. Each of the detection circuits has a function to convert a current flowing through the piezo-type load sensor 25 into a damping force and a damping force variation in accordance with an application force to the shock absorber 2 due to the vehicle-running road surface and outputs the conversion results to the CPU 4a. On the basis of the output signals of the damping force detecting circuit 55 and the output signals of the waveform shaping circuit 56 for waveshaping the input signals from the above-mentioned sensors 50, 51 and the switches 52, 53 into signals suitable for the electronic control unit 4, the CPU 4a decides the vehicle-running road surface state, the vehicle-running state and others, and outputs a control signal to the corresponding high-voltage application circuit 61 so as to change the damping characteristic of the corresponding shock absorber 2.

The high-voltage power circuit 60 is arranged to periodically shut off the current, which passes through the primary side coil of the transformer 60c, in accordance with an output signal of an oscillator (not shown) so as to produce a high voltage at the secondary side coil of the transformer 60c. The high-voltage power circuit 60 is composed of a high-voltage power control circuit 60a and a field effect transistor (which will hereinafter to be referred to as an FET) 60d concurrently with the above-mentioned transformer 60c and current-detection resistor 60b. The FET 60d is coupled in series between the primary coil of the transformer 60c and the current-detection resistor 60b and is connected to the high-voltage power control circuit 60a which in turn performs the periodic ON and OFF control of the FET 60d. The the high-voltage power control circuit 60a further performs ON and OFF control of the FET 60d on the basis of a control signal from the CPU 4a. That is, the CPU 4a shuts off the current, which passes through the primary coil of the transformer 60c, by the OFF control of the FET 60d executed through the power control circuit 60a when abnormality occurs with respect to the voltage developed at the secondary coil of the transformer 60c. Also included in half-wave-rectifying the secondary side currents of the transformer 60c and capacitors 60g and 60h which are respectively coupled in parallel to the secondary side coil of the transformer 60c so as to smooth and store the charge. Here, in the high-voltage power circuit 60, a middle tap of the secondary side coil of the transformer 60c and an junction point between the capacitors 60h and 60g are respectively grounded. With above-mentioned arrangement, in response to a control signal from the CPU 4a, the high-voltage power control circuit 60a performs an voltage-increasing operation in the high-voltage power circuit 60.

Figure 4A:
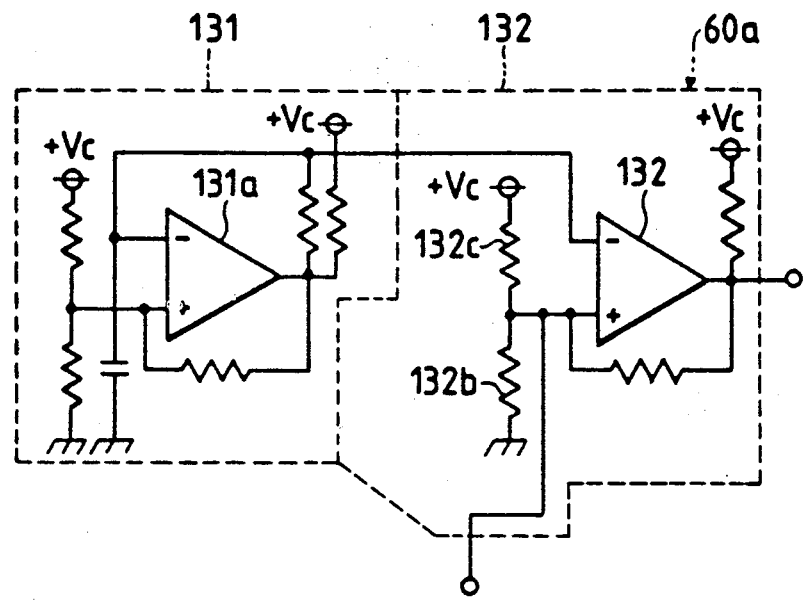
FIG. 4A is a circuit diagram showing an arrangement of a high-voltage power control circuit of a high-voltage power circuit of the drive system of this embodiment.

The high-voltage power control circuit 60a, as illustrated in FIG. 4A, is composed of a triangular-wave generation circuit 131 and a pulse-width modulation circuit 132. The triangular-wave generation circuit 131 is a function to generate a triangular-wave signal at a predetermined interval, and the pulse-width modulation circuit 132 includes a voltage divider comprising two resistors 132b and 132c to divide a direct-current voltage +Vc (=5V). The output of the voltage divider is supplied to a comparater 132a which is also coupled to the output of a comparater 131a of the triangular-wave generation circuit 131. A junction point between the voltage divider and the comparater 132a is coupled to the output port 4f of the electronic control unit 4. The comparater 132a generates a pulse signal only under the condition that the level of a triangular-wave signal from the triangular-wave generation circuit 131 is lower than a division signal from the voltage divider, the pulse signal therefrom being fed to the EFT 60d. Thus, the pulse width of the pulse signal from the comparater 132a varies in accordance with the division voltage therefrom.

The high-voltage application circuit 61 applies a high voltage from the high-voltage power circuit 60 as a drive voltage to the corresponding piezo-type actuator 27 in accordance with a control signal (a damping force changing signal) from the CPU 4a so as to change over the damping force of the corresponding shock absorber 2. More specifically, when the damping force changing signal from the CPU 4a is a low-level signal, a high-voltage of 500V is applied to the piezo-type actuator 27 to be expanded, and when the damping force changing signal therefrom is a high-level signal, a voltage of −100V is applied to the piezo-type actuator 27 to be contracted. Here, as illustrated in FIG. 3, diodes are respectively connected between the high-voltage application circuits 61 and the piezo-type actuators 27.

Thus, the damping force characteristic of each of the shock absorbers 2 takes a small damping force (SOFT) when the piezo-type actuator 27 is expanded by the high-voltage application because in FIG. 2 the flow rate of the operating oil between the first and second hydraulic chambers 21 and 23 in the shock absorber 2 is increased. On the other hand, the damping force characteristic thereof assumes a large damping force (HARD) when the piezo-type actuator is contracted by the discharge of the charge due to the negative-voltage application because of decrease in the flow rate of the operating oil therebetween.

The rapidly discharging circuit 62, being coupled to the secondary coil of the transformer 60c of the high-voltage power circuit 60, is for rapidly and compulsorily discharging the electric charge accumulated in each of the piezo-type actuators 27 and is equipped with an FET 62b, a resistor 62c and a rapidly discharging control circuit 62a. The FET 62b and resistor 62c are connected in serial to each other and both are coupled in parallel between both the outputs of the secondary coil of the transformer 60c thereof, and the rapidly discharging control circuit 62a performs the ON and OFF control of the FET 62b in accordance with a control signal from the CPU 4a. Thus, the CPU 4a outputs the control signal to the rapidly discharging control circuit 62a so that the FET 62b enters into the ON state to cause the secondary side of the transformer 60c to be shorted so as to rapidly and compulsorily discharge through the resistor 62c the electric charge accumulated in each of the piezo-type actuators 27.

Figure 4B:
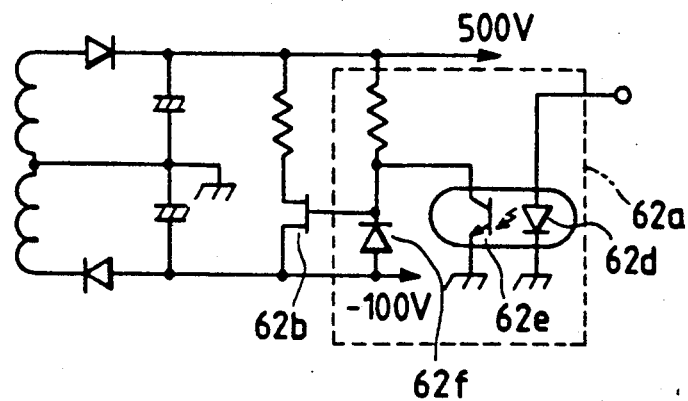
FIG. 4B is a circuit diagram showing an arrangement of a rapidly discharging control circuit of a rapidly discharging circuit of the drive system of this embodiment.

FIG. 4B shows a circuit arrangement (a portion enclosed in a dotted line) of the rapidly discharging control circuit 62a. In FIG. 4B, when a signal outputted from the CPU 4a through the output port 4f is in the high-level state, a light-emitting diode 62d is energized so as to cause a phototransistor 62e to enter into the conducting state whereby the base voltage of the FET 62b becomes zero. Thus, the FET 62b is kept to be in the shutting-off state. Here, when the signal from the CPU 4a is switched to be in the low level state, the phototransistor 62e enters into the non-conducting state. Thus, a voltage determined by a Zener diode 62f is applied to the base of the FET 62b, which in turn enters into the conducting state.

Figure 5:
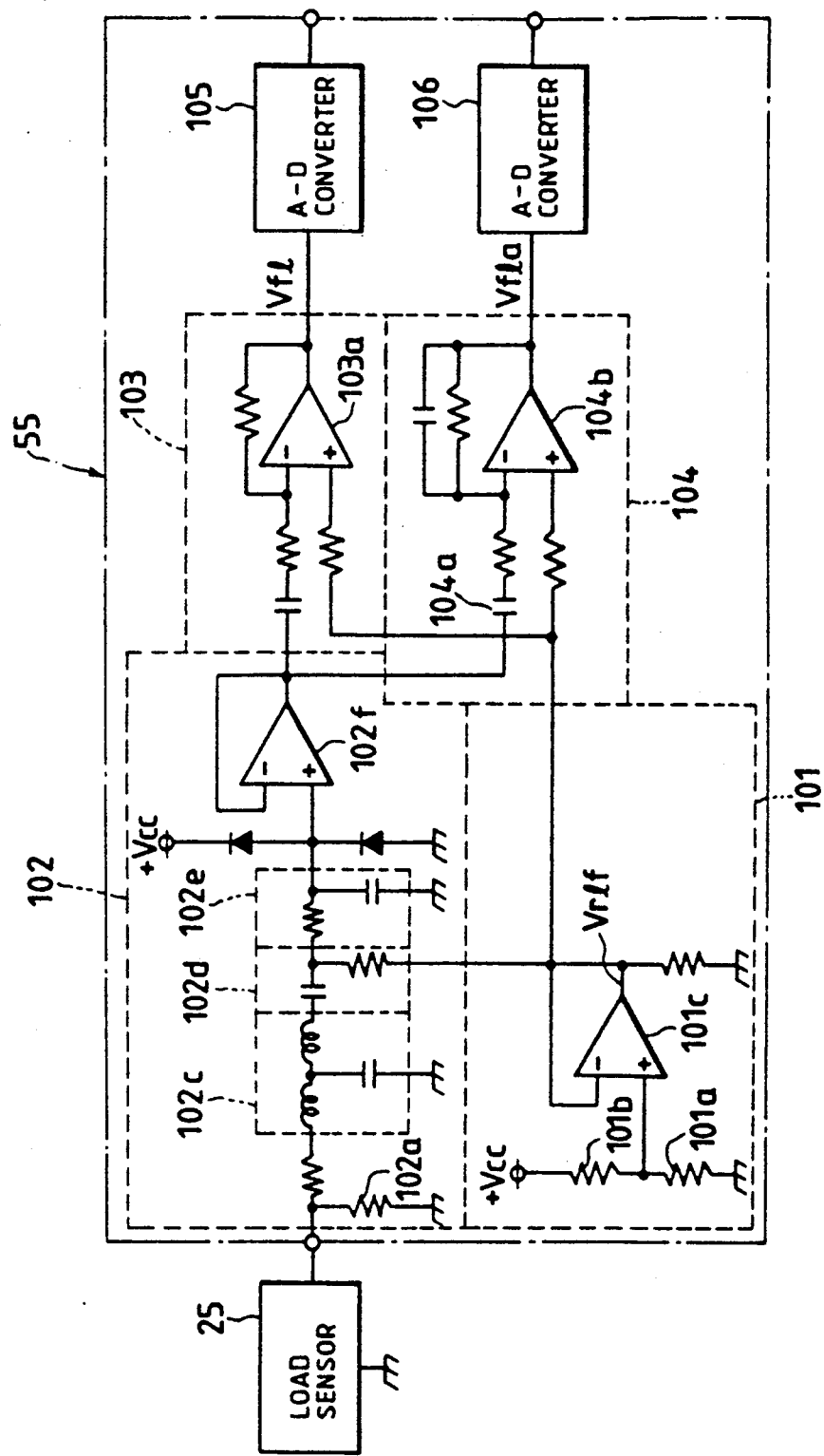
FIG. 5 is a circuit diagram illustrating an arrangement of a damping force detection circuit of the drive system of this embodiment.

A description will be made hereinbelow in terms of the damping force detecting circuit 55 and the high-voltage application circuit 61 with reference to FIGS. 5 and 6. In FIG. 5, the damping force detecting circuit 55 comprises a reference voltage generating section 101, a damping force variation detecting section 102, an amplifying section 103, an integration section 104 and A/D converters 105 and 106. The reference voltage generating section 101 divides a direct-current voltage +Vcc (=+5V) by means of resistors 101a and 101b and generates the division voltage as a reference voltage Vrlf (=+2V) through a buffer 101c. The damping force variation detecting section 102, being coupled to each of the piezo-type load sensors 25, is composed of a resistor 102a which develops a terminal voltage (see B of FIG. 11) corresponding to a current due to a load detection voltage from the piezo-type load sensor 25, the terminal voltage thereof being applied to a radio-wave noise filter 102c. The variation of the amount of the current introduced into the resistor 102a corresponds to the variation of the load to the shock absorber 2, i.e., the variation of the damping force thereof. The radio-wave noise filter 102c eliminates the radio-wave noises in the terminal voltage of the resistor 102a. The output signal of the radio-wave noise filter 102c is supplied to a by-pass filter 102d so as to remove low-frequency components below 0.1 Hz from the outout signals of the radio-wave filter 102c. Further, the by-pass filter 102d is responsive to the reference voltage Vrlf from the reference voltage generating section 101 to level-shift the non-filtered components to become higher by the reference voltage Vrlf and output it as a shift filter signal. Thereafter, a low-pass filter 102e eliminates the high-frequency components above 100Hz from the shift filter signal and outputs the non-filtered component as a filter signal, which is in turn fed to a buffer 102f so as to generate as a buffer signal the filter signal from the low-pass filter 102e, the buffer signal being a damping force variation detection signal. The amplifying section 103 is equipped with an inversion-type operational amplifier 103a which is responsive to the reference voltage Vrlf from the reference voltage generating section 101 and further the damping force variation detection signal from the above-described damping force variation detecting section 102, so as to amplify the damping force variation detection signal under the feedback operation of a feedback resistor 103e to output the amplified signal as a damping force variation amplification signal Vfl. Further, the integration section 104 includes a direct-current shut-off capacitor 104a to a direct-current component of the detection signal Vfl therefrom to output the remaining frequency component as a filter signal. An inversion-type operational amplifier 104b receives the reference voltage Vrlf and further receives the filter signal from the capacitor 104a so as to integrate the filter signal on the basis of the reference voltage Velf to output the integration signal as a damping force signal Vfla representing the damping force of the shock absorber 2. Here, the frequency of the integration signal from the operational amplifier 104b is in a range between 0.1Hz and 10Hz. The A/D converters 105 and 106 perform analog-to-digital conversion with respect to the amplification signal Vfl and the damping force signal Vfla.

Figure 6:
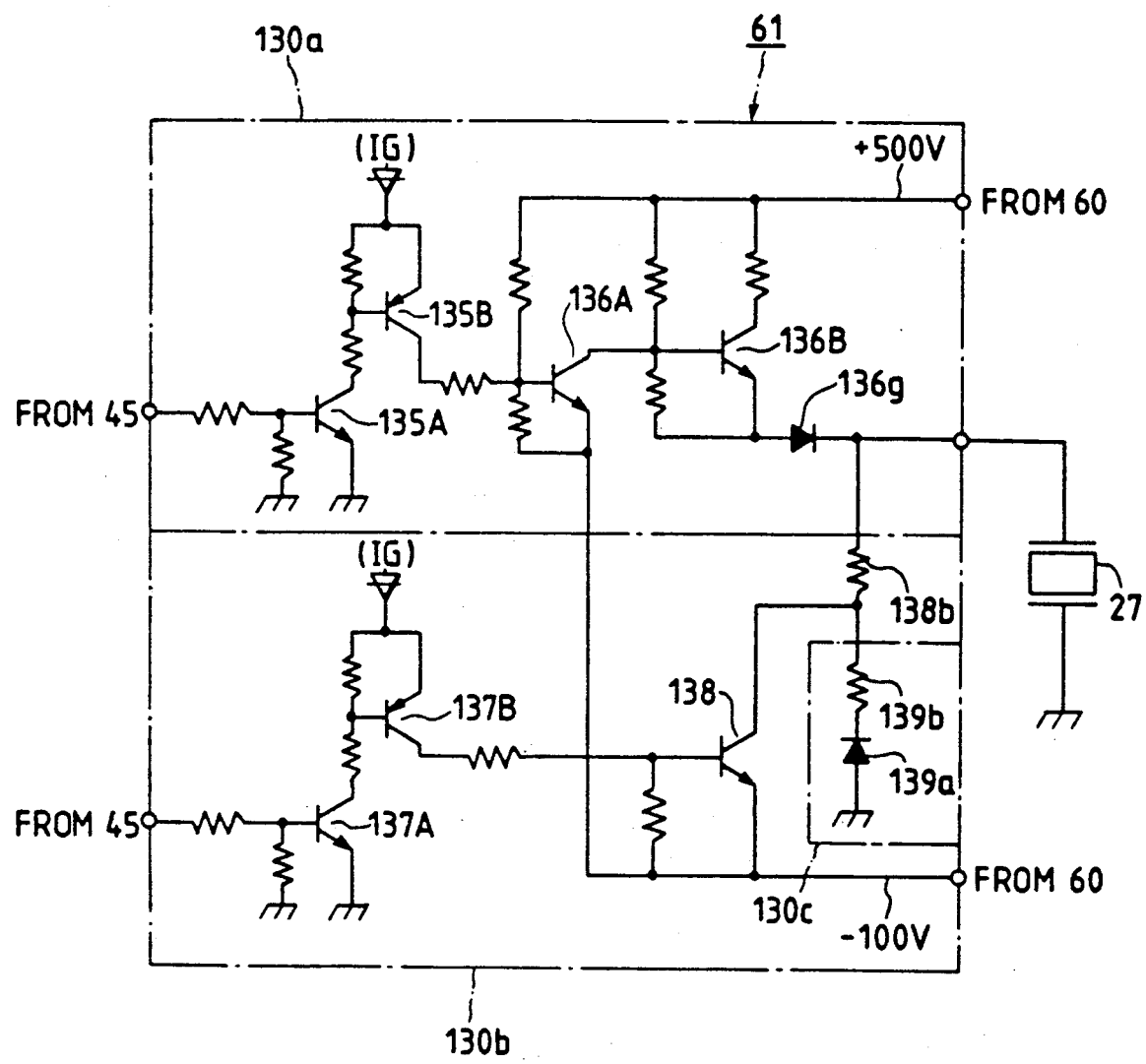
FIG. 6 is a circuit arrangement of a high-voltage application circuit of the drive system of this embodiment.

In FIG. 6, the high-voltage application circuit 61 comprises a positive-voltage application section 130a, a negative-voltage application section 130b and a zero-voltage application section 130c. The positive-voltage application section 130a includes a transistor 135A which becomes conductive under control of the CPU 4a and further includes a transistor 135B which is at its base coupled to the collector of the transistor 135A and connected to the ignition switch (IG) of the motor vehicle so as to take a conduction state by means of the conduction of the transistor 135A under the power feeding due to the vehicle battery. A transistor 136A is at its base connected to the collector of the transistor 135B and to one terminal (+500V) of the high-voltage power circuit 60 and further at its emitter coupled to the other terminal (−100V) thereof. A transistor 136B is at its base coupled to the collector of the transistor 136A and also coupled to the one terminal of the high-voltage power circuit 60. The emitter of the transistor 136B is coupled through a counter-flow blocking diode 136g to the piezo-type actuator 27. That is, the transistor 136B applies to the piezo-type actuator 27 the high positive voltage (+500V) from the high-voltage power circuit 60 only when the transistor 136A enters into the conducting state. On the other hand, the negative-voltage application section 130b includes transistors 137A and 137B corresponding to the transistors 135A and 135B in the positive-voltage application section 130a and further includes a transistor 138 which is at its base and emitter coupled to the other terminal (−100V) and which is at its collector coupled to the piezo-type actuator 27. Thus, the transistor 138 applies to the piezo-type actuator 27 the negative voltage (−100V) from the high-voltage power circuit 60 only when the transistor 137B is in the conducting state. Further, the zero-voltage application section 130c comprises a diode 139a which is at its anode grounded and at its cathode coupled through resistors 138b and 139b to the piezo-type actuator 27. With this arrangement, the negative charge energy in the piezo-type actuator 27 is discharged with a time constant which is determined by the combined resistance of the resistors 139b and 138b and the electrostatic capacity of the piezo-type actuator 27.

Figure 7:
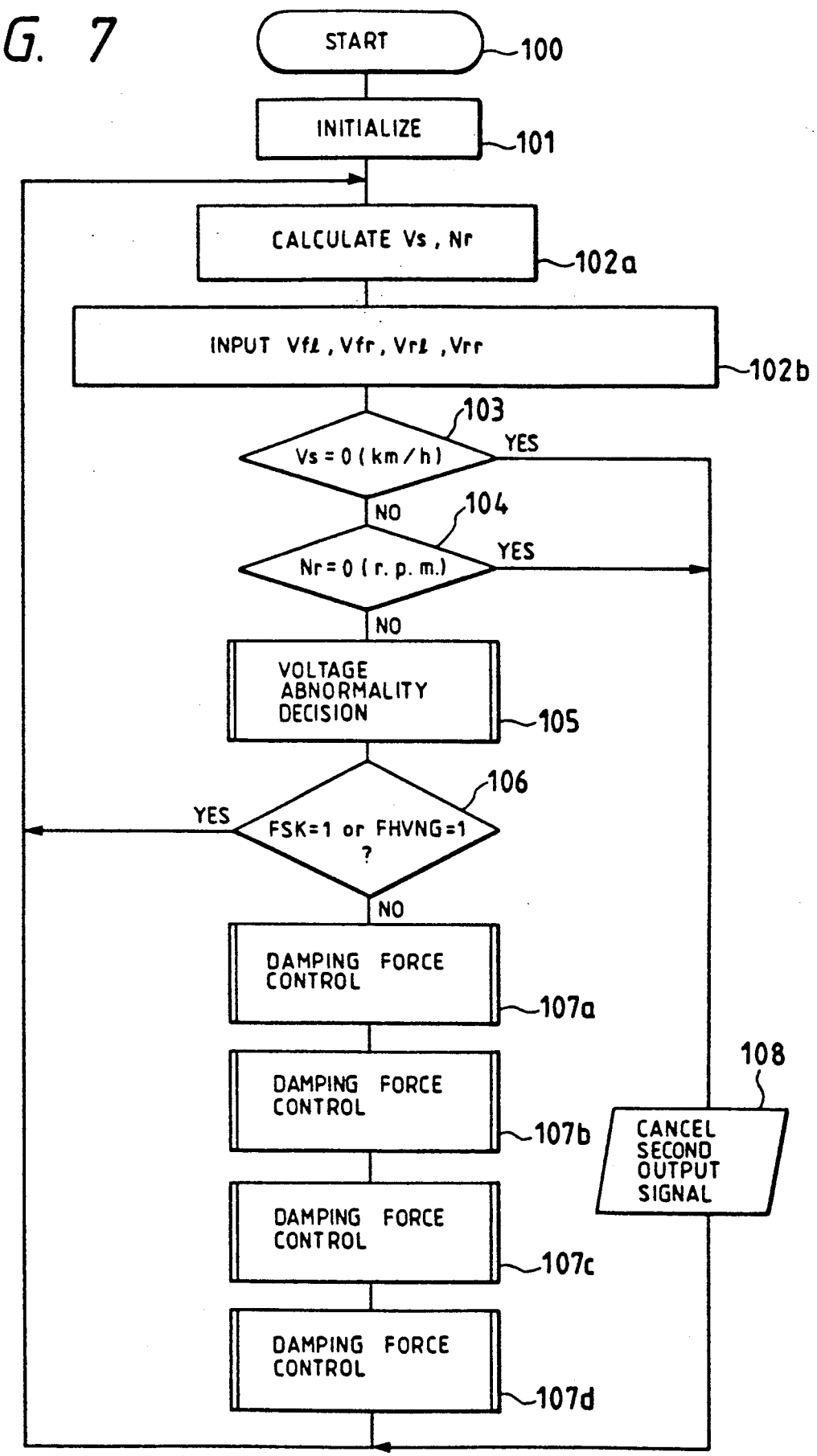
FIG. 7 is a flow chart showing a program executed by the electronic control unit of the drive system of this embodiment.
Figure 8:
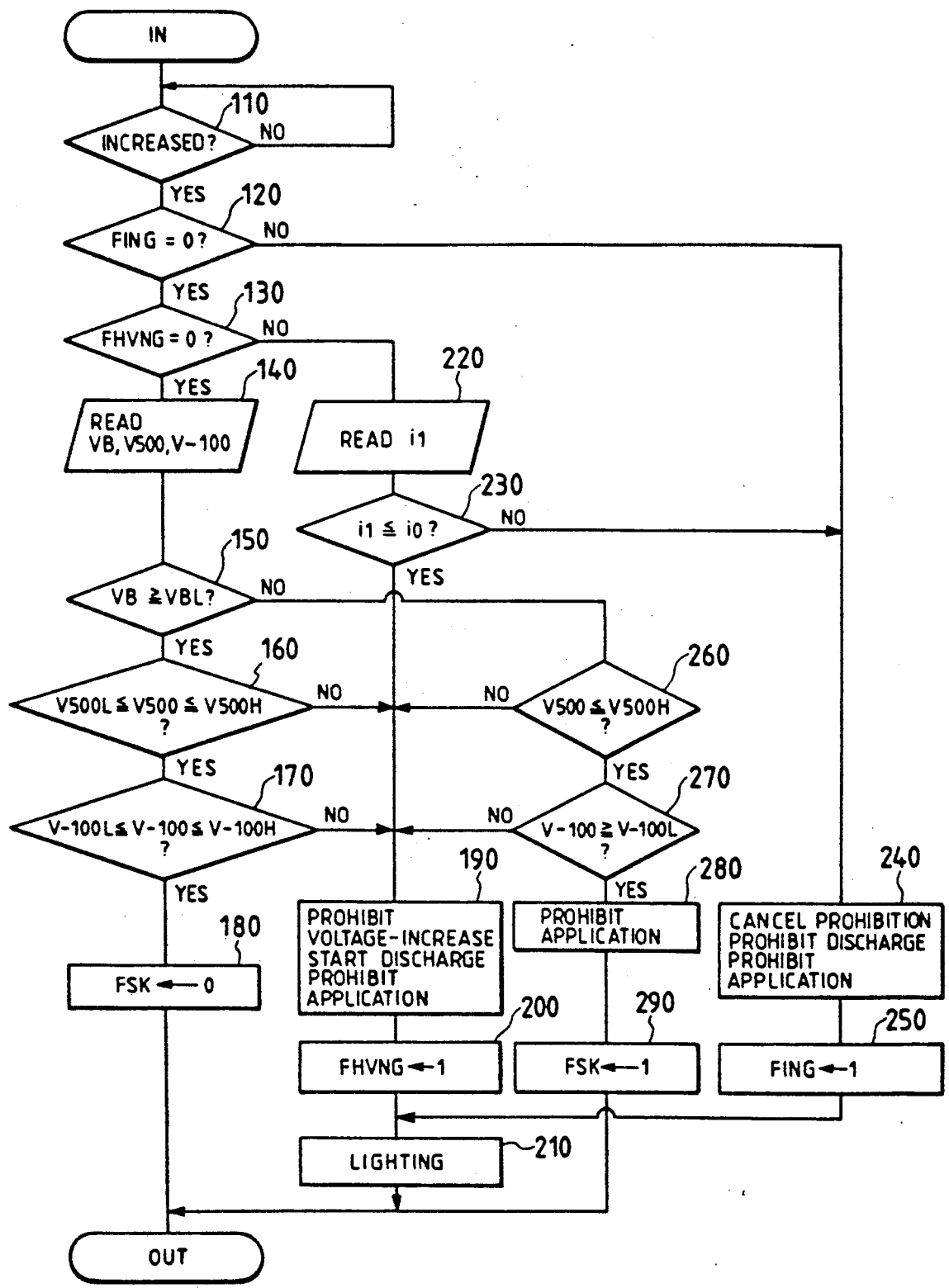
FIG. 8 is a flow chart showing an operation of a voltage abnormality decision block of the FIG. 7 flow chart.

Operation to be executed by the electronic control unit 4 will be described hereinbelow with reference to FIGS. 7 and 8. In FIG. 7, the operation starts with a block 100 in response to the turning-on of the ignition switch (IG) of the motor vehicle, then followed by a block 101 to performan initialization. A subsequent block 102a is executed in order to calculate a speed Vs of the motor vehicle and a speed Nr of the vehicle engine on the basis of the signals from the waveform shaping circuit 56. When the front wheel (for example 5FL) goes over a projection as illustrated in (A) of FIG. 11 so that the shock absorber 2 contracts, the terminal voltage of the resistor 102a (FIG. 5) varies as illustrated in (B) of FIG. 11 whereby the damping force variation detection signal from the buffer 102f (FIG. 5) varies as illustrated in (C) of FIG. 11. Thus, the damping force amplification signal Vfl from the amplification section 103 (FIG. 5) varies as illustrated in (D) of FIG. 11 and further the damping force signal Vfla from the integration section 104 (FIG. 5) varies as illustrated in (E) of FIG. 11.

After the execution of the block 102a, a block 102b is executed to input the damping force variation signals Vfl, Vfr, Vrl and Vrr. Blocks 103 and 104 follow to check whether the vehicle speed Vs=0 km/h and whether the engine speed Nr =0 rpm. If both the answers in the blocks 103 and 104 are negative, the operation advances to a block 105 for decision of abnormality and further to a block 106. The blocks 105 and 106 will be described hereinafter with reference to FIG. 8. After the execution of the block 106, blocks 107a to 107d are executed so as to perform damping force control for the respective shock absorbers 2 which will hereinafter be described in detail with reference to FIG. 9. On the other hand, if both the answers in the aformentioned blocks 103 and 104 are not negative, the operation goes to a block 108 which will be described hereinafter.

A description will be made hereinbelow in terms of the block 105 in FIG. 7, followed by the block 106, with reference to FIG. 8. In FIG. 8, the operational flow goes to a step 110 in order to check whether in the high-voltage power circuit 60 the voltage-increasing is completed so as to allow the drive of the piezo-type actuator 27. In response to the completion of the voltage-increasing, control advances to a step 120 to check whether a voltage-increasing prohibition abnormality flag FING is set to be "0" and further to a step 130 to check whether a high-voltage abnormality flag FHVNG is set to be "0". At the time of the turning-on of the vehicle ignition switch, both the flags FING and FHVNG are set to be "0" under consideration that there is no problem in terms of the power system, and hence control proceeds to the next step 140. The step 140 is for reading through the A/D converter 59 the battery voltage VB and both the output voltages V500 and V-100 of the high-voltage power circuit 60. After the execution of the step 140, steps 150, 160 and 170 follow in order to check whether the battery voltage VB and the output voltages V500, V-100 are respectively in predetermined ranges as expressed by the following equations.

$$VB > VBL \tag{1}$$

$$V500L < V500 < V500H \tag{2}$$

$$V\text{-}100L < V\text{-}100 < V\text{-}100H \tag{3}$$

where VBL represents a lower limit decision value of the battery voltage, V500L and V500H designate upper and lower limit values, i.e., abnormality decision values, of one output voltage of the high-voltage power circuit 60, and V-100L and V-100H depict upper and lower limit values, i.e., abnormality decision values, of the other output voltage of the high-voltage power circuit 60.

If all the decision results in the steps 150 to 170 are affirmative, control goes to a subsequent step 180 to reset a damping-force control prohibition flag FSK to "0" indicating that the battery voltage VB is in a narmal state. When the flag FSK is "1", the battery voltage VB is in a low-level state so as not to allow application of a sufficient drive voltage to the piezo-type actuator 27, thereby prohibiting the damping foce control with respect to the shock absorber 2. The step 180 is followed by the block 106 in FIG. 7 which is for checking whether the flag FSK = 1 or the flag FHVNG = 1. If the decision result in the block 106 is affirmative, the operational flow returns to the block 102a, and if the decision result therein is negative, the operational flow directs to the damping-force control blocks 107a to 107d.

On the other hand, although the decisions in the above-mentioned steps 120, 130 and 150 are respectively affirmative, that is, although there is no abnormality in the power system, in the case that at least one of the decisions in the steps 160 and 170 is negative, control goes to a step 190 under a consideration that any abnormality occurs at the high-voltage power circuit 60 side (the drive-voltage generation side) and/or the piezo-type actuator 27 side (load side). In the step 190, the high-voltage power circuit 60 prohibits the voltage-increasing, the rapidly discharging circuit 62 starts the rapid discharging, and the high-voltage application circuit 61 stops the high-voltage application to the piezo-type actuator 27. That is, when the drive-voltage generation side and/or the load side enters into an abnormal state, the high-voltage power control circuit 60a turns off the EFT 60d so as to stop the voltage-increasing in the high-voltage power circuit 60 to prevent the voltage-increasing from being kept as it is, and the rapidly discharging control circuit 62a turns on the EFT 62b to start the rapid discharging through the resistor 62c in the rapidly discharging circuit 62 so as to compulsorily discharge the charge accumulated in the piezo-type actuator 27. Due to the execution of the step 190, the piezo-type actuator 27 is contracted to return to the original position illustrated in FIG. 2B so that the damping force characteristic of the shock absorber 2 is fixed to the HARD characterisitic. The step 190 is followed by a step 200 in which the high-voltage abnormality flag FHVNG is set to be "1" indicating that the high voltage to the piezo-type actuator 27 is abnormal and the voltage-increasing in the high-voltage power circuit 60 has been prohibited, then followed by a step 210 in which the CPU 4a outputs a lighting command signal to the output circuit 58 so as to turn on the abnormality-informing lamp 57. After the completion of the step 210, the operational flow goes to the block 106 in FIG. 7.

Thus, when the flag FHVNG is once set to be "1", the decision in the step 130 becomes negative, thereby being followed by a step 220 to read the primary side current il of the transformer 60c of the high-voltage power circuit 60 through the A/D converter 59. A subsequent step 230 checks whether the current il is in an appropriate range defined in accordance with the following equation.

$$il \leq i0 \tag{4}$$

where i0 represents an excessive-current decision value of the primary side current of the transformer 60c.

If the answer in the step 230 is affirmative, control goes to the above-mentioned step 190. On the other hand, if the answer in the step 230 is negative, that is, when the primary side current is excessive, control goes to a step 240 as well as in the case the decision in the step 120 is "NO". Here, since the primary side current il is excessive irrespective of prohibiting the voltage-increasing in the high-voltage power circuit 60 in the above-mentioned step 190, under the decision that an abnormal state occurs in the high-voltage power circuit 60, in order to simultaneously perform the voltage-increasing (notwithstanding the prohibition of the voltage-increasing in the step 190) and the compulsory discharging, the voltage-increasing prohibition of the high-voltage power circuit 60 executed in the step 190 is cancelled and the rapid discharging of the rapidly discharging circuit 62 also executed in the step 190 is stopped by turning off the EFT 62b thereof. In addition, in order to prevent the piezo-type actuator 27 from being driven by the abnormal voltage application, the high-voltage application due to the application circuit 61 is prohibited continuously. As a result, the execution of the step 240 causes the shock absorber to be fixed to the the HARD state as well as the execution of the step 190.

After the execution of the step 240, a step 250 is executed to set the voltage-increasing prohibition abnormality flag FING to "1" representing that the primary side current il is excessive irrespective of the voltage-increase prohibition, then followed by the above-mentioned abnoramlity-informing lamp 57 energizing step 210.

On the other hand, even if the answer in the step 230 is that the primary side current il is below the excessive-current decision value i0, since the decision in the step 130 is that the power system for application of a voltage to the piezo-type actuator 27 is in an abnormal state, the operational flow goes to the step 190. Further, if the decision in the step 150 is that the battery voltage VB is below the lower-limit decision value VBL, the operational flow goes to steps 260 and 270 to check whether the output voltages V500 and V-100 of the high-voltage poweer circuit 60 satisfy the following equations, respectively.

$$V500 < V500H \tag{5}$$

$$V\text{-}100 < V\text{-}100 \tag{6}$$

If in the steps 260 and 270 both the output voltages V500 and V-100 thereof satisfy the aforementioned equations, under a consideration that, in addition to the lowering of the battery voltage VB, the output voltages of the high-voltage power circuit 60 is insufficient for driving the piezo-type actuator 27, control advances to a step 280 in order to prohibit the application of a high voltage to the piezo-type actuator 27 by means of the high-voltage application circuit 61. The step 280 is followed by a step to set the flag FSK to "1", then followed by the block 106 in FIG. 7. If the decisions in the steps 260 and 270 are respectively "NO", under a consideration that, in addition to the lowering of the battery voltage VB, any abnormality occurs at the drive-voltage generation side and/or the load side, the operational flow similarly goes to the above-mentioned step 190.

As described above, for performing the damping force changing operation of the shock absorber 2, the piezo-type actuator drive system, i.e., the damping force control syste, according to this embodiment always checks whether the output voltages of the high-voltage power circuit 60 are respectively in appropriate ranges, and if the output voltages thereof are considered to be in the abnormal states, assuming that any abnormality occurs at the high-voltage generation side (high-voltage power circuit 60 side) and/or the load side (piezo-type actuator 27 side), the electronic control unit 4 prohibits the voltage-increasing in the high-voltage power circuit 60, starts the rapid discharging through the rapidly discharging circuit 62, and further prohibits the high-voltage application of the high-voltage application circuit 61 to the piezo-type actuator 27.

Accordingly, it is possible to surely prevent damages of the piezo-type actuator 27 due to the excessively high voltage application, heating and damages of the high-voltage power circuit 60 due to the excessive voltage-increasing, and undesirable expansion of the piezo-type actuator 27 due to application of a voltage which is out of an appropriate range. Thus, even if any abnoramlity occurs in terms of the output voltages of the high-voltage power circuit 60 due to damages of circuit elements and others, it is possible to prevent the damping force changing in the abnormal states so as to keep the comfortable ride of the motor vehicle. Further, in this embodiment, since the decision is not made in terms of whether the output voltages of the high-voltage power circuit 60 are in adequate ranges when the battery voltage VB is lowered, the abnoramlity detection is not effected on the basis of the lowering of the output voltages thereof due to the lowering of the battery voltage VB, i.e., lack of the voltage-increasing in the high-voltage power circuit 60. In addition, it is possible to prevent the application of an unsufficient voltage to the piezo-type actuator 27, thereby improving the reliability in changing the damping force of the shock absorber 2.

Still further, in this embodiment, in the case that the primary side current il of the transformer 60c is excessive irrespective of prohibition of the voltage-increasing in the high-voltage power circuit 60, the prohibition thereof is cancelled so that the high-voltage power circuit 60 returns to the state before the voltage-increasing prohibition and the rapid discharging is prohibited in the rapidly discharging circuit 62. Therefore, the voltage-increasing (high voltage output) and compulsory discharging are not performed simultaneously, thereby protecting the high-voltage power circuit 60 and the rapidly discharging circuit 62.

Although as described above the current passing through the primary coil of the transformer 60c is detected and is cut off when the drive voltage developed at the secondary coil of the transformer 60c is abnormal, when the current passing therethrough is detected irrespective of the cutting-off, the discharging of the charge in the piezoelectric device of the piezo-type actuator 27 is prohibited. This operation is effective because of preventing the voltage lowering particularly in the case of use of a battery in which the electric enery to be used is limited. The flow of the current into the primary coil develops the drive voltage at the secondary coil and, at this time, when both the ends of the secondary coil are coupled through a resistor, the power is consumed due to the resistor.

Figure 9:
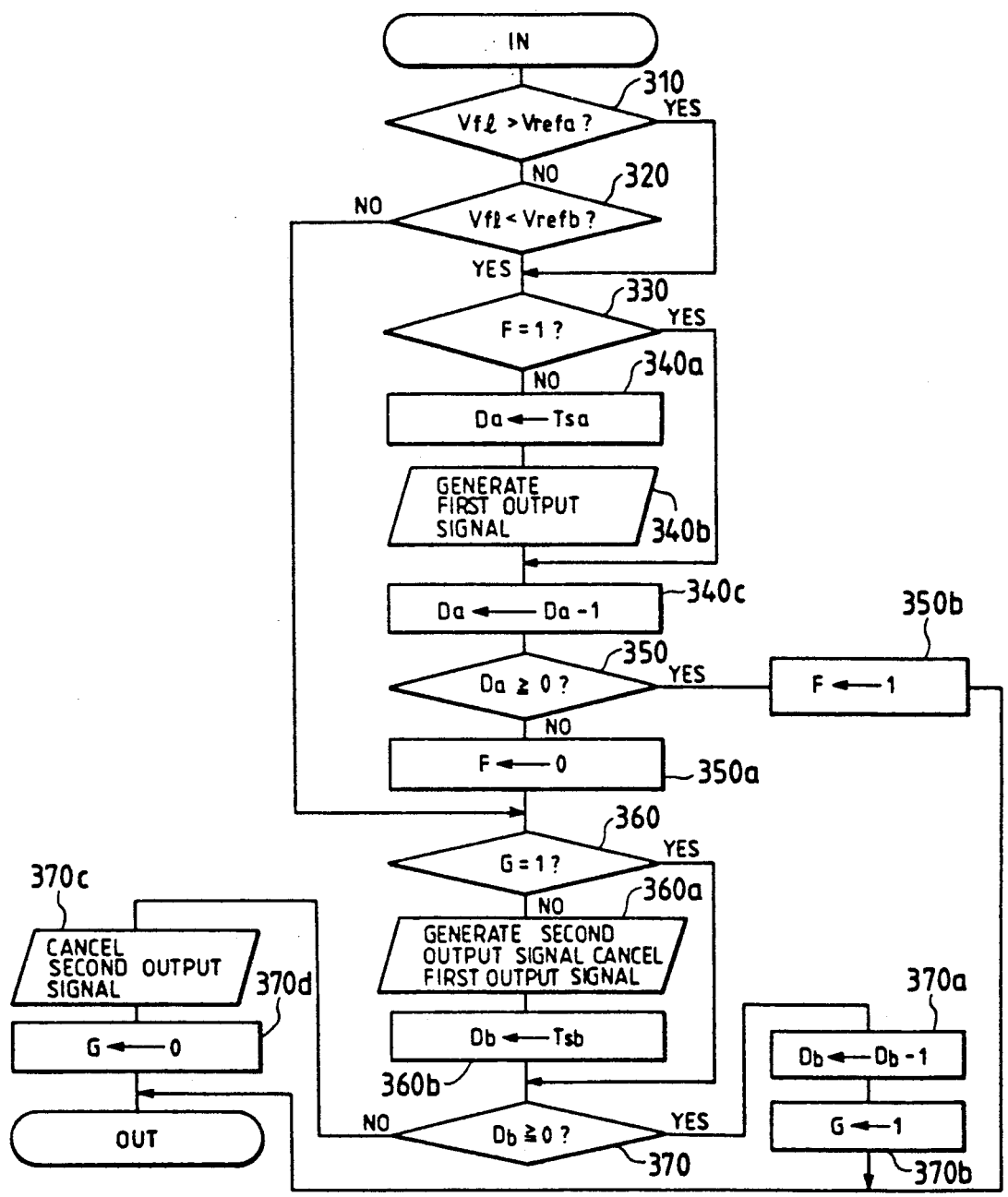
FIG. 9 is a flow chart showing an operation of a damping force control block of FIG. 7 flow chart.

A description will be made hereinbelow in terms of the operation of the blocks 107a to 107d in FIG. 7 with reference to FIG. 9. Here, the description will be made with respect to the shock absorber 2FL (step 107a) for the front-left wheel 5FL. In FIG. 9, a step 310 is provided in order to compare the damping force variation value (i.e., damping force variation amplification value) Vfl, which has been read in the block 102b in FIG. 7, with an upper limit setting value Vrefa to check whether Vfl> Vrefa. If the decision in the step 310 is "NO", control goes to a subsequent step 320 to compare the damping force variation Vfl with a lower limit setting value Vrefb to check whether Vfl< Vrefb. The setting values Vrefa and Vrefb act as thresholds for determining the state of the vehicle-running road surface and are in advance stored in the ROM 4b of the electronic control unit 4.

When the front-left wheel 5FL runs on a projection as illustrated in (A) of FIG. 11 the damping force variation value Vfl decreases beyond the lower limit setting value Vrefb as illustrated in (D) of FIG. 11, the CPU 4a decides that control proceeds to a step 330 because of Vfl< Vrefa and Vfl< Vrefb, and determines a flag F=0 in the step 330 (F=0 has been set previously in a step 350a which will be described hereinafter). The step 330 is followed by a step 340a to set a predetermined time Tsa to a count value Da. Here, the predetermined time Tsa is a time necessary for keeping the damping force of the shock absorber 2FL to the SOFT mode and is stored in advance in the ROM 4b.

After the execution of the step 340a, the CPU 4a performs the next step 340b to generate a first output signal (first control signal) which is for setting the damping force of the shock absorber 2FL to the SOFT mode and further to cause a second output signal (second control signal), for setting the damping force thereof to the HARD mode, to cease to exist. That is, in response to the generation of the first output signal from the CPU 4a, a positive high voltage (+500V) is applied as the drive voltage from the high-voltage power circuit 60 through the high-voltage application circuit 61 to the piezo-type actuator 27, which in turn expands so that the shock absorber 27 takes the SOFT mode (see F of FIG. 11). A step 340c is then executed to subtract 1 from the count value Da to update the subtraction result as a count value Da, followed by a step 350 to check whether Da≧0. If the answer in the step 350 is "YES", control goes to a step 350b to set the flag F to "1". After the execution of the step 350b, the operational flow proceeds to the next damping force control block 107b.

Figure 11:
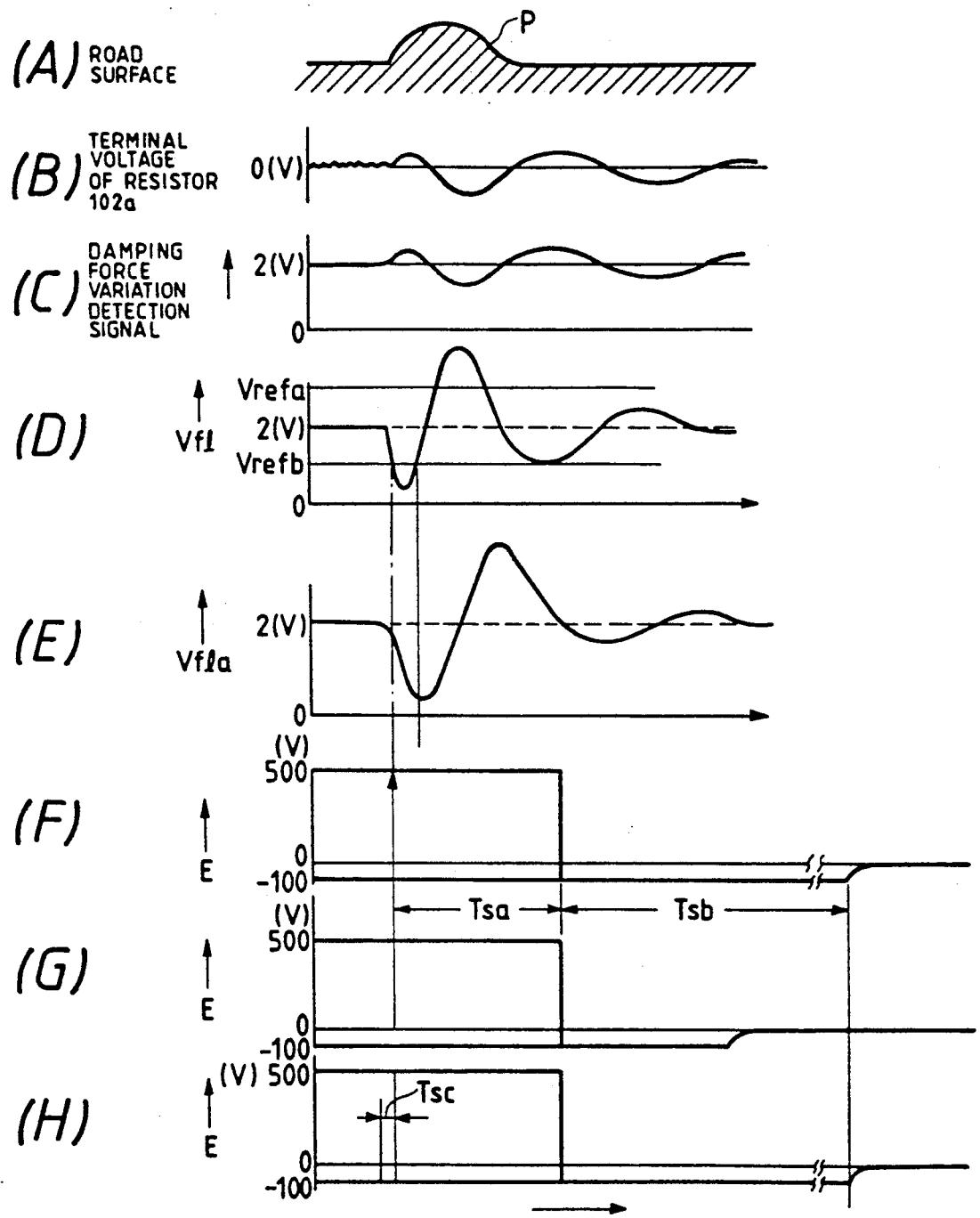
FIG. 11 is a timing chart for describing the operation executed by the electronic control unit of the drive system of this embodiment.

When the decision in the step 350 becomes "NO" after elapse of a time Tsa as illustrated in (F) of FIG. 11, a step 350a follows to set the flag F to "0", then followed by a step 360 to check whether a flag G is set to be "1". Here, assuming that the flag G has previously been set to "0" in a step 370d which will be described hereinafter, control goes to a step 360a to generate the second output signal which is for setting the damping force of the shock absorber 2FL to the HARD mode and further to cause the first output signal for the SOFT mode to disappear. That is, in response to the generation of the second output signal from the CPU 4a, a negative high voltage (−100V) is applied as the drive voltage from the high-voltage power circuit 60 through the high-voltage application circuit 61 to the piezo-type actuator 27, which in turn expands so that the shock absorber 27 takes the HARD mode.

After the execution of the step 360b, control advances to a step 360b to set a predetermined time Tsb (see (F) of FIG. 11) as a count value Db, then followed by a step 370 to check whether Db≧0. Here, since Db≧0, control goes to a step 370a to subtract 1 from the count value Db to update the count value Db with the subtraction result, then followed by a step 370b to set the flag G to "1". After the execution of the step 370b, the operational flow also goes to the block 107b in FIG. 7. The predetermined time Tsb is a time necessary for keeping the damping force of the shock absorber 2 to the HARD mode and stored in advance in the ROM 4b of the electronic control unit 4.

When the decision in the step 370 becomes "NO" in response to elapse of the predetermined time Tsb, control goes to a step 370c in which the second output signal disappears with the first output signal disappearing, and step 370d to set the flag G to "0". The step 370d is also coupled to the next damping force control block 107b. In response to the second output signal disappearing, the high-voltage application circuit 61 stops the application of the negative high voltage from the high-voltage power circuit 60 to the piezo-type actuator 27, whereby the negative charge energy in the piezo-type actuator 27 discharges as illustrated in (F) in FIG. 11. The energy discharging depends upon the time constant which is determined by the combined resistance of the resistors 138b and 139b (see FIG. 6) and the capacity of the piezo-type actuator 27. Thus, the negative high voltage in the piezo-type actuator 27 becomes the zero level after elapse of a time corresponding to the time constant.

After in the step 360b the count value Db is set to the predetermined time Tsb and before in the step 370 the decision is made as "NO", in cases where the motor vehicle once stops or when the vehicle engine stops, the CPU 4a takes the affirmative decision in the block 103 or 104 in FIG. 7 so as to execute the block 108 in which the second output signal disappears before elapse of the predetermined time Tsb. Thus, the high-voltage application circuit 61 stops the application of the negative high voltage (−100V) from the high-voltage power circuit 60 to the piezo-type actuator 27, whereby a charge energy in the piezo-type actuator 27 is started to be discharged before the elapse of the predetermined time Tsb as illustrated in (G) of FIG. 11 so that the voltage in the piez-type actuator 27 becomes zero with the above-mentioned time constant before the elapse of the predetermined time Tsb.

In this embodiment, as described above, the damping force of the shock absorber 2 is set to be in the SOFT mode by means of the application of the positive high voltage (+500V) to the piezo-type actuator 27 till the negative decision in the step 350 after the affirmative decision in the step 320, the damping force thereof is set to take the HARD mode by means of the application of the negative high voltage (−100V) thereto till the negative decision in the step 370 after the negative decision in the step 350, and the voltage in the piez-type actuator 27 becomes zero with the above-mentioned time constant after the negative decision in the step 370.

The fact that the actuator voltage quickly returns to zero with the time constant allows protection of the wiring system between the piezo-type actuator 27 and the high-voltage application circuit 61 because the voltage in the wiring system similarly returns quickly to zero so as to minimize the time period of the generation of the high voltage in the wiring system therebetween. Further, when the motor vehicle stops or the vehicle engine stops before -[the negative decision in the step 370, CPU 4a takes the affirmative decision in the block 103 or 104 in FIG. 7 so as to execute the block 108 to return the actuator voltage to zero as well as the case that the decision in the step 370 in FIG. 9 is negative. Thus, it is similarly possible to minimize the generation time period of the high voltage in the wiring system between the high-voltage application circuit 61 and the piez-type actuator 27.

Figure 10:
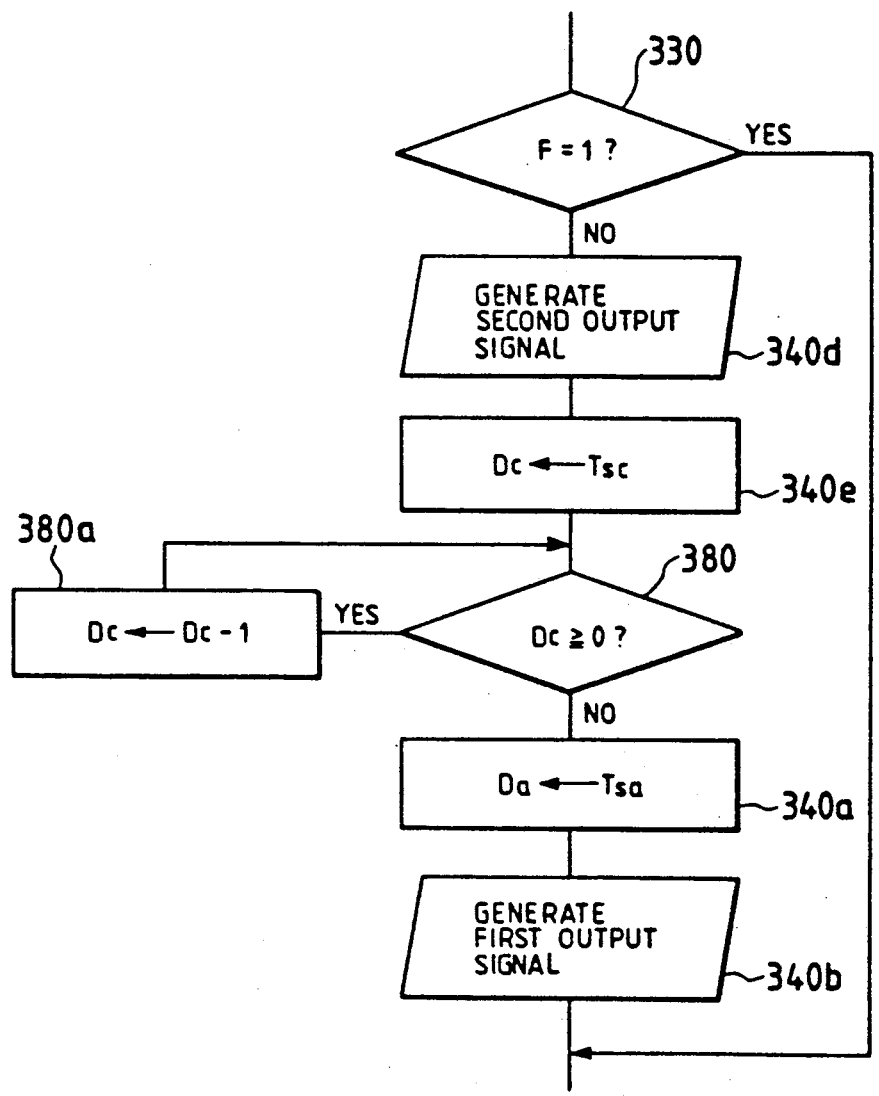
FIG. 10 is a flow chart showing another operation of the damping force control block of the FIG. 7 flow chart.

FIG. 10 shows a modification of the damping force control operation of the shock absorber 2 illustrated in FIG. 9, in which steps corresponding to those in FIG. 9 are marked with the same numerals and characters and the description will be omitted for brevity. In FIG. 10, when the decision in the step 330 is negative, steps 340d and 340e follow in order to generate the second output signal and to set a predetermined time Tsc to a count value Dc. At this time, the terminal voltage of the piezo-type actuator 27 is zero. The predetermined time Tsc is a time necessary for more adequately perform the damping force changing control of the shock absorber 2 by means of the hysteresis of the piezo-type actuator 27 and stored in advance in the ROM 4b of the electronic control unit 4. After the execution of the step 340e, control goes to a step 380 in order to check whether Dc>0. Here, since the answer in the step 380 is affirmative, the control advances to a step 380a to subtract 1 from the count value Dc and updat the count value Dc with the subtraction result. If the answer in the step 380 changes to "YES", the CPU 4a successively executes the above-described steps 340a and 340b.

Thus, in this modification, in chaning the damping force of the shock absorber 2 to the SOFT mode, the negative high voltage (−100V) is applied to the piezo-type actuator 27 during the predeterimed time Tsc, before the positive high voltage (+500V) is applied thereto. This causes the fact that, due to the hysteresis, the expansion of the piezo-actuator 27 after the contraction thereof becomes more effective, thereby improving the response when the shock absorber 2 is changed to the SOFT mode.

Figure 12:
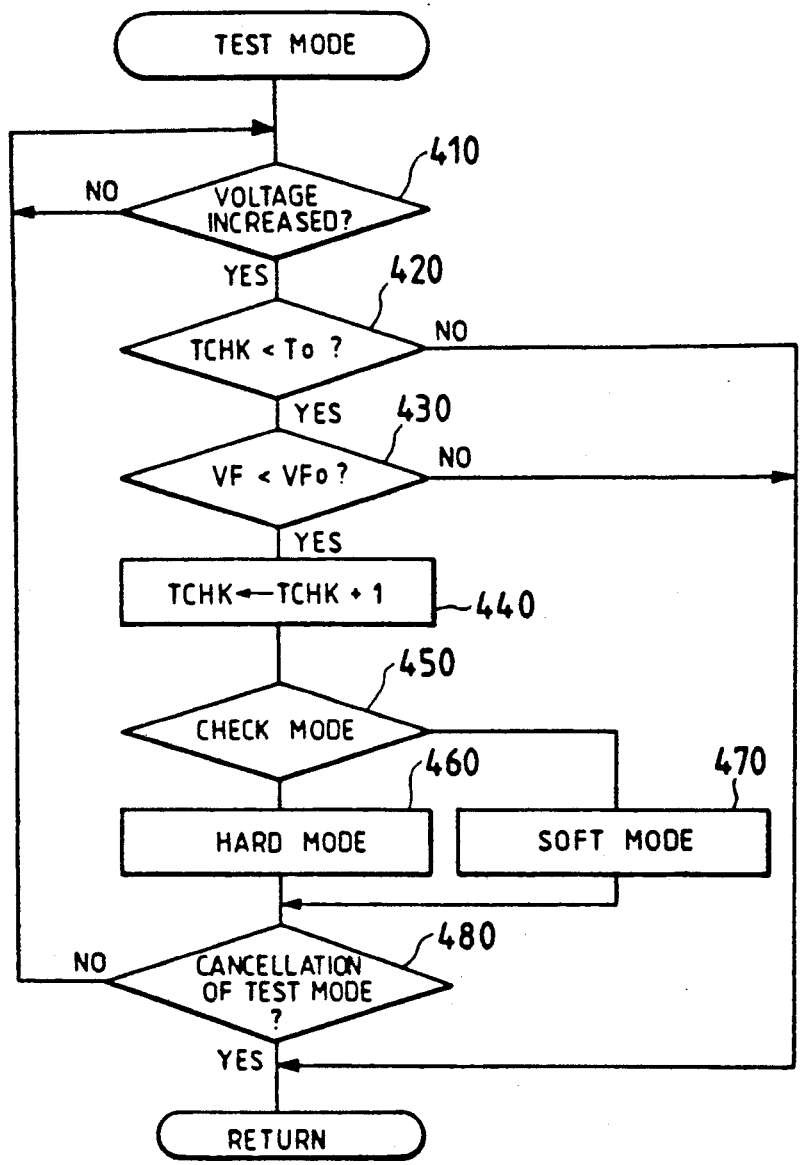
FIG. 12 is a flow chart for describing a damping force test mode to be performed by the electronic control system of the drive system of this invention.

A description will be made hereinbelow in terms of a damping force test mode with reference to FIG. 12. This test mode is arranged to be started in response to turning-on of the test switch illustrated at numeral 63 in FIG. 3. In FIG. 12, a step 410 is first executed in order to check the elapse time after the turning-on of the ignition switch (IG) of the motor vehicle to confirm the completion of the voltage-increasing in the high-voltage power circuit 60 sufficient to the drive of the piezo-type actuator 27. In response to the completion of the voltage-increasing, a step 420 follows to check whether a count value TCHK is smaller than a predetermined value To. The count value TCHK shows an elapse time after the start of the damping force test, i.e., the turning-on of the test switch 63. If the answer is "YES", a step 430 is then executed to check whether the motor vehicle starts or whether the speed VF of the motor vehicle calculated on the basis of the detection signal of the vehicle speed sensor 51 is lower than a predetermined value (for example 5 km/h). That is, the steps 420 and 430 are provided in order to check the satisfaction of the damping force test execution conditions. If the decision in the step 430 is "YES", a step 440 is executed to increment the count value TCHK by 1, then followed by a step 450 to check the test mode, that is, confirm whether the test mode is for changing the damping force from the SOFT mode to the HARD mode or for changing the damping force from the HARD mode to the SOFT mode, on the basis of a signal from the test mode changing switch 64. In accordance with the decision result of the step 450, a step 460 or 470 is executed so as to set the damping force of the shock absorber 2 to the HARD mode or SOFT mode by applicating the positive or negative high voltage to the piezo-type actuator 27 for testing. After the execution of the step 460 or 470, the operational flow goes to a step 480 to check the cancellation of the test mode on the basis of the signal from the test switch 63. If the answer in the step 480 is negative, the operational flow returns to the step 410, and if affirmative, this routine terminates. Further, if the answer in the step 420 or 430 is negative, this routine also terminates.

With the above-described operation, although the damping force test is executed in response to the turning-on of the test switch 63 by the vehicle driver or the like, when a predetermined time sufficient to execution of the damping force test is elapsed or when the motor vehicle starts, the test mode is compulsorily cancelled irrespective of the continuous turning-on of the test switch 63 so as to stop the damping force test, thereby adequately performing the damping force control in accordance with the vehicle-running road surface state or the vehicle-running state.

Figure 13:
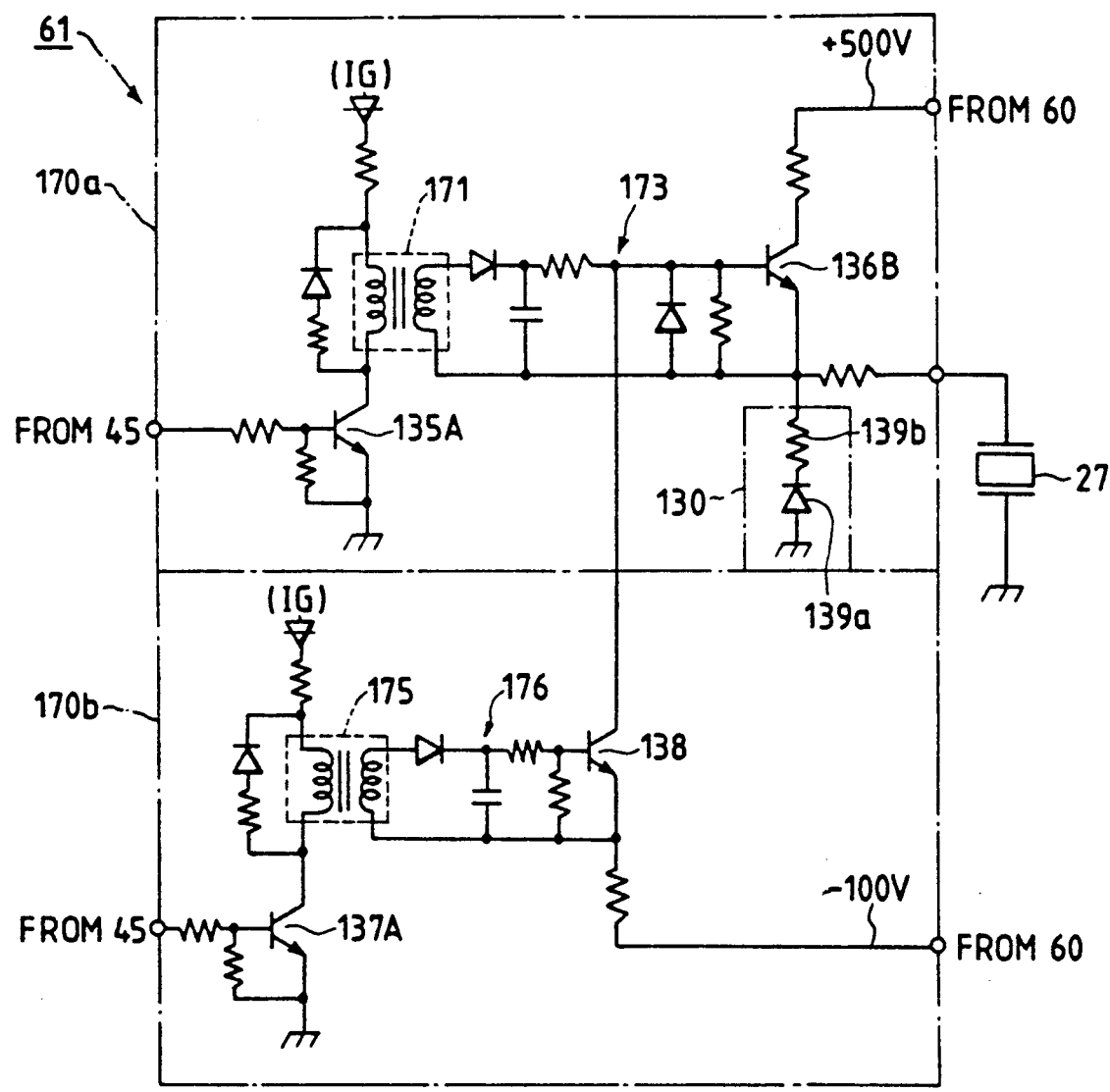
FIG. 13 is a circuit diagram showing another arrangement of the high-voltage application circuit of the drive system of this embodiment.

FIG. 13 is a circuit diagram showing another arrangement of the high-voltage application circuit 61. In FIG. 13, the application circuit 61 comprises a positive voltage application section 170a, a negative voltage applicatin section 170b and a zero-voltage application section 130c having the same structure as the zero-voltage application section illustrated at 130c in FIG. 6. The positive voltage application section 170a is composed of a pulse transformer 171 which is at one end portion connected to the ignition switch (IG) of the motor vehicle and which is at the other end portion coupled to a transistor 135A whose base is responsive to the first output signal from the CPU 4a. The transistor 135A is operable intermittently in response to the first output signal having a series of first pulses. The pulse transformer 171 is at the primary coil energized intermittently by the power feed from the vehicle battery whereby pulse voltages are developed at the secondary coil thereof and then applied through a smoothing circuit 173 to the base of a transistor 136B. This causes the positive high voltage (+500V) to be applied to the piezo-type actuator 27. On the other hand, the negative voltage application section 170b similarly includes a pulse transformer 175 which is at one end portion coupled to the ignition switch (IG) and which is at the other end portion coupled to a transistor 137A whose base is responsive to the second output signal from the CPU 4a. The transistor 137A is operable intermittently in response to the second output signal comprising a series of second pulses so that the pulse transformer 175 is at the primary coil energized by the power feed from the vehicle battery to cause the secondary coil thereof to develop pulse voltages, which are in turn applied through a smoothing circuit 176 to the base of a transistor 138. The transistor 138 cuases the negative high voltage to be applied to the piezo-type actuator 27.

It should be understood that the foregoing relates to only preferred embodiments of the invention, and that it is intended to cover all changes and modifications of the embodiments of the invention herein used for the purposes of the disclosure, which do not constitute departures from the spirit and scope of the invention. For example, although in this embodiment the control system of a piezo-type actuator is described in relation to shock absorber of a mtor vehicle, it is also appropirate to apply the piezo-type actuator control system of this invention to other fields such as a fuel injection drive apparatus. Further, although in the above description the abnormality is decided on the basis of the output voltage of the transformer 60c in addition to the primary side current of the transformer 60c, it is also appripriate to decide the abnormality on the basis of either the output voltage or the primary side current. Still further, although in the above-described embodiment the change of the damping force is not made until the ignition switch is turned off when the output voltage abnormality once occurs and the change of the damping force is effected when the ignition switch is again turned on, it is also appropriate to continuously check the output voltage after the occurrence of the voltage abnormality and allow the damping force changing under the conditions such as cancellation of the voltage abnormality and elapse of a predetermined time.

What is claimed is:

1. A drive system of a piezo-type actuator for use in a motor vehicle, said piezo-type actuator being constructed with a piezoelectric device which is expandable and contractible in accordance with application of a voltage thereto, said drive system comprising:
   voltage-increasing means for increasing an output voltage of a power source mounted on said motor vehicle so as to develop a drive voltage for said piezo-type actuator;
   application means for applying to said piezoelectric device of said piezo-type actuator said drive voltage developed by said voltage-increasing means;
   abnormality detection means for detecting an abnormality of said drive voltage developed by said voltage-increasing means;
   prohibition means for prohibiting the output of said drive voltage from said voltage-increasing means to said piezoelectric device thereof in response to the detection of the drive voltage abnormality; and
   discharging means for discharging charges accumulated in said piezoelectric device thereof in response to the detection of the drive voltage abnormality.

2. A drive system for use in a motor vehicle, comprising:
   a piezo-type actuator comprising a piezoelectric device which is expandable and contractible in accordance with application of a voltage thereto;
   voltage-increasing means for increasing an output voltage of a power source mounted on said motor vehicle so as to develop a drive voltage for said piezo-type actuator;

application means for applying to said piezoelectric device of said piezo-type actuator said drive voltage developed by said voltage-increasing means;

abnormality detection means for detecting an abnormality of said drive voltage developed by said voltage-increasing means; and safety control means for prohibiting the application of said drive voltage to said piezoelectric device thereof and further discharging charges accumulated in said piezoelectric device thereof when said abnormality detection means detects the abnormality of the developed drive voltage.

3. A system as claimed in claim 2, wherein said safety control means prohibits the application of said drive voltage from said application means to said piezoelectric device thereof and further prohibiting the output of said drive voltage from said voltage-increasing means so as to prohibit the supply of the drive voltage to said piezoelectric device thereof in response to the detection of the drive voltage abnormality by said abnormality detection means.

4. A system as claimed in claim 2, wherein said voltage-increasing means is composed of a transformer with a primary coil and a secondary coil, and said safety control means cuts off a current passing through said primary coil thereof when an abnoramlity occurs with respect to said drive voltage developed at said secondary coil thereof so as to prohibit the development of said drive voltage at said secondary coil thereof.

5. A system as claimed in claim 4, wherein said safety control means comprises current detection means for detecting a current flowing through said primary coil thereof and prohibition means for prohibiting the discharging of the accumulated charge in said piezoelectric device of said piezo-type actuator when said current detection means detects the current flow irrespective of cutting-off of the current to said primary coil thereof.

6. A system as claimed in claim 2, wherein said abnormality detection means is arranged to detect the abnormality when said drive voltage developed by said voltage-increasing means deviates from a predetermined voltage range.

7. A system as claimed in claim 6, wherein said voltage-increasing means produces a positive voltage and a negative voltage each of which is used as said drive voltage, and said abnormality detection means detects the abnormality in terms of each of said positive and negative voltages.

8. A system as claimed in claim 7, wherein said application means applies to said piezoelectric device thereof the negative drive voltage developed by said voltage-increasing means so that said piezoelectric device is contractible and stops the application of the negative drive voltage thereto in response to elapse of a predetermined time period after the application.

9. A system as claimed in claim 7, wherein said application means applies the negative drive voltage to said piezoelectric device thereof prior to application of the positive drive voltage thereto.

10. A system as claimed in claim 2, further comprising stop detection means for detecting that at least one of said motor vehicle and an engine of said vehicle is in a stopping state and prohibition means for prohibiting the output of said drive voltage from said voltage-increasing means in response to the detection by the stop detection means.

11. A system as claimed in claim 2, further comprising mode setting means for setting said piezo-type actuator to a test mode in accordance with an external operation, test application means for continuously applying said drive voltage from said voltage-increasing means to said piezoelectric device of said piezo-type actuator during the setting of said test mode, and mode cancellation means for cancelling said test mode when a predetermined condition is satisfied.

12. A system as claimed in claim 11, wherein said mode cancellation means cancels said test mode when a predetermined time is elapsed after the setting of said test mode or when said motor vehicle starts.

* * * * *